United States Patent
Chih-Po et al.

(10) Patent No.: US 6,340,631 B1
(45) Date of Patent: Jan. 22, 2002

(54) METHOD FOR LAYING OUT WIDE METAL LINES WITH EMBEDDED CONTACTS/VIAS

(75) Inventors: Huang Chih-Po, Chu-Tong; Tsai Hann-Huei; Lai Tsung-Mu, both of Hsin-Chu, all of (TW)

(73) Assignee: Taiwan Semiconductor Manufacturing Company, Ltd, Hsin Chu (TW)

( * ) Notice: Subject to any disclaimer, the term of this patent is extended or adjusted under 35 U.S.C. 154(b) by 0 days.

(21) Appl. No.: 09/584,112

(22) Filed: May 31, 2000

(51) Int. Cl.$^7$ .......................................... H01L 21/4763
(52) U.S. Cl. ...................... 438/618; 438/666; 438/668; 438/669; 257/734; 257/773; 257/774; 257/775
(58) Field of Search ................................ 438/618, 666, 438/668, 669; 257/734, 773–775

(56) References Cited

U.S. PATENT DOCUMENTS

| | | | |
|---|---|---|---|
| 4,242,698 A | * 12/1980 | Ghate et al. | 357/71 |
| 4,656,732 A | * 4/1987 | Teng et al. | 29/591 |
| 5,610,833 A | * 3/1997 | Chang et al. | 364/491 |
| 5,981,384 A | * 11/1999 | Juengling | 438/666 |
| 6,218,696 B1 | * 4/2001 | Radius | 257/302 |
| 6,222,738 B1 | * 4/2001 | Maeno et al. | 257/775 |

* cited by examiner

Primary Examiner—John F. Niebling
Assistant Examiner—Lynne Gurley
(74) Attorney, Agent, or Firm—Tung & Associates

(57) ABSTRACT

A method for laying out wide metal lines with embedded contacts/vias that has improved process window and an electronic substrate that has having such layout exposed and developed thereon are provided. In the method, the wide metal lines are provided with zig-zag shaped borders in either a waveform or in an interlacing form such that a processing window that is at least 5% larger than the line-to-line spacing for straight-line bordered metal lines is achieved. In a wave form, each one of contacts/vias of the first metal line is positioned juxtaposed to a corresponding contact/via in the second metal line. In the interlacing form, each of the contacts/vias being positioned juxtaposed to a pre-set spacing in between the contacts/vias in the second metal line. Both the wave and interlacing form wide metal lines layout can be used to improve the process window during a photolithographic process.

14 Claims, 3 Drawing Sheets

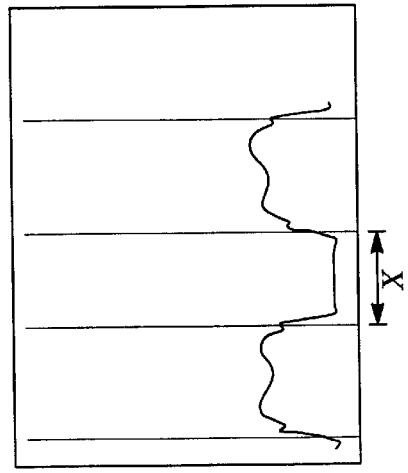
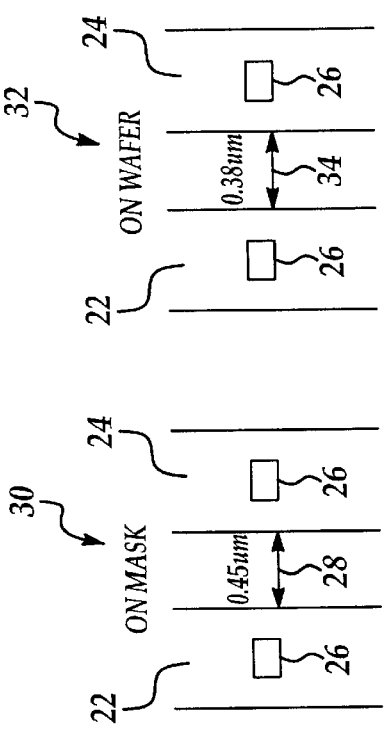
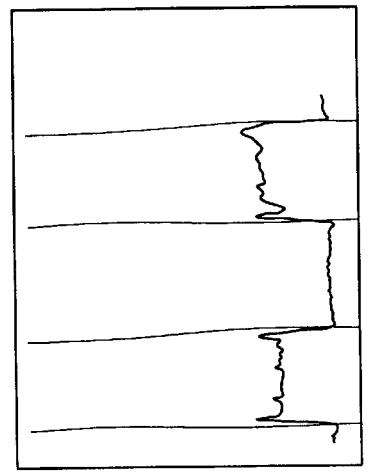
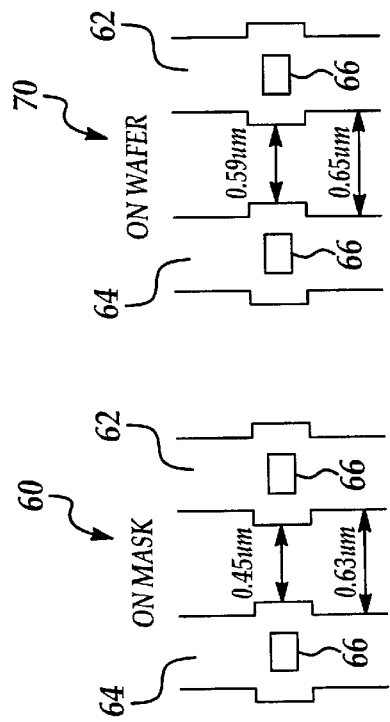

METHOD FOR LAYING OUT WIDE METAL LINES WITH EMBEDDED CONTACTS/VIAS

FIELD OF THE INVENTION

The present invention generally relates to a method for laying out an IC circuit on a mask for use in a photolithographic process and more particularly, relates to a method for laying out metal lines that are wider than 5 μm with embedded contacts/vias on a photomask that has improved process window when used in a subsequent photolithographic process.

BACKGROUND OF THE INVENTION

In the continuing miniaturization of integrated circuit devices, the circuit layout process becomes more stringent as the dimensions become smaller. The old requirements in design rules are being tightened, while new requirements are being initiated for the ever shrinking devices. A complete IC fabrication process usually requires between 10 to 20 masking steps according to the complexity of the device and the fabrication process. Each masking step introduces some changes in the surface dimensions, whether they are in the silica substrate or in the film layers deposited on top of the substrate. Minimal-dimension rules, as part of the design rules, are governed by the processing requirements or the physical property requirements of the IC device. For instance, when the minimal spacings are violated, in the case of wide metal lines on top of a silicon wafer, various problems can occur in the circuit operation. The wide metal lines generally refer to metal lines that have a width of at least 5 μm, or preferably at least 10 μm. In order to fabricate circuits that have high reliability, circuit designers use the minimal design rules for the construction of various layers on top of a silicon substrate.

While many design factors are involved in determining the minimal design rules, some of the most important factors includes the line-width tolerances, junction depth and lateral diffusion, thickness tolerances, and masking tolerances. For instance, the line-width dimension on a finished wafer usually differs from the corresponding line-width dimension on the photomask. This is due to the fact that the photolithographic and etching steps used to pattern the line generally shrink or expand the original line by a biased amount. Due to the statistical nature of the bias, the shrinkage or expansion produces another uncertainty of the line width. The amount of bias and uncertainty of the line width depend very much on the processing equipment and procedure.

The process window for a specific fabrication process is a very important parameter in achieving process reliability and control. When a specific processing equipment is used for performing a process, the performance of the equipment depends on many parameters. A small change in any of the process parameters may induce a corresponding change in the performance of the equipment. The window of operation for the specific equipment is therefore defined as the specific limits of the response induced by the change in parameter. For instance, when the photoresist of a masking layer is exposed in a stepper, the exposure dosage greatly affects the line width of the photoresist. Higher dosage produces smaller line width. In the operation of the stepper machine, there is therefore a specific range of dosage that can be used to obtain the acceptable line width. A term of sensitivity of the process therefore defines the incremental change of line width that occurs upon a change of dosage. In designing a manufacturing process, it is desirable to have as large a process window and as small a sensitivity as possible, in order to tolerate large variations in equipment performance.

One example of the desirability of a large process window is the photolithographic process for laying out wide metal lines on a semiconductor wafer. The wide metal lines, i.e., generally wider than 5 μm or preferably wider than 10 μm, cause a smaller photo process window than that normally found on narrower metal lines, i.e., in dimensions of less than 1 μm. The narrow process window for the wide metal lines can cause severe processing problems, such as forming metal lines that are easily bridged or having leakage between the lines. In order to avoid such problems, larger space rule has been used for laying out the wide metal lines. The problem is more severe when the wide metal lines are embedded with contacts or vias.

It is therefore an object of the present invention to provide a method for laying out wide metal lines that are imbedded with contacts/vias that does not have the drawbacks or shortcomings of the conventional methods.

It is another object of the present invention to provide a method for laying out wide metal lines that are imbedded with contacts/vias on a photomask that has improved process window.

It is a further object of the present invention to provide a method for laying out wide metal lines that are imbedded with contacts/vias on a photomask by utilizing zig-zag bordered metal lines.

It is another further object of the present invention to provide a method for laying out wide metal lines that are imbedded with contacts/vias on a photomask that has improved process window by utilizing a zig-zag bordered metal line that forms waveformed borders after exposure on a wafer surface.

It is still another object of the present invention to provide a method for laying out wide metal lines that are imbedded with contacts/vias on a photomask with improved process window by providing zig-zag bordered metal lines such that each contact/via is positioned juxtaposed to a corresponding contacts/vias in an adjacent metal line.

It is yet another object of the present invention to provide a method for laying out wide metal lines that are imbedded with contacts/vias on a photomask with improved process window by using zig-zag bordered metal lines such that a contact/via in the first metal line is positioned juxtaposed to a spacing between contacts/vias in an adjacent second metal line.

It is still another further object of the present invention to provide a semiconductor wafer that has patterns of wide metal lines exposed thereon which include a first metal line exposed on the wafer surface that has a first plurality of contacts/vias embedded therein wherein each of the contacts/vias is positioned juxtaposed to a corresponding contact/via in an adjacent second metal line.

It is yet another further object of the present invention to provide a semiconductor wafer that has patterns of wide metal lines exposed thereon which includes a first metal line exposed on the wafer surface that has a first plurality of contacts/vias embedded therein such that each of the contacts/vias is positioned juxtaposed to a spacing between contacts/vias in an adjacent second metal line.

SUMMARY OF THE INVENTION

In accordance with the present invention, a method for laying out wide metal lines embedded with contacts/vias on a photomask with improved process window and semiconductor substrates that have patterns of wide metal lines exposed thereon are provided.

In a preferred embodiment, a method for laying out wide metal lines imbedded with contacts/vias on a photomask with improved process window can be carried out by the operating steps of first laying out a first metal line that has zig-zag borders, a width of at least 5 $\mu$m and a first plurality of contacts/vias along at least one of two opposite edges of the line with the contacts/vias in protruded portions of the zig-zag on a photomask, each of the first plurality of contacts/vias is spaced from its immediate adjacent contact/via at a pre-set spacing, and laying out a second metal line that has zig-zag borders, a width of at least 5 $\mu$m and a second plurality of contacts/vias along at least one of two opposite edges of the line with the contacts/vias in protruded portions of the zig-zag on the photomask, each of the second plurality of contacts/vias is spaced from its immediate adjacent contact/via at the preset spacing, each of the second plurality of contacts/vias is further positioned to align either with a corresponding contact/via in the first metal line or a spacing between two adjacent contacts/vias in the first metal line such that a process window that is larger than a line-to-line spacing for metal lines that have straight-line borders is obtained in a subsequent photolithographic process.

In the method for laying out wide metal lines imbedded with contacts/vias on a mask with improved process window, the first and the second metal lines each has a width of at least 10 $\mu$m. The zig-zag borders change into a wave form after being exposed and developed onto a wafer. The zig-zag borders may have a square saw-tooth shape. The method may further include the step of positioning the second metal line next to the first metal line such that each of the second plurality of contacts/vias in the second metal line is juxtaposed to one of the first plurality of contacts/vias in the first metal line. The method may further include the step of positioning the second metal line next to the first metal line such that each of the second plurality of contacts/vias in the second metal line is juxtaposed to one of the spacing between two adjacent contacts/vias in the first metal line. The process window may be at least 5% larger than the line-to-line spacing for metal lines that have straight-line borders. The process window may be between about 5% and 30% larger than the line-to-line spacing for metal lines that have straight-line borders.

The present invention is further directed to a semiconductor wafer that has patterns of wide metal lines exposed thereon which includes a semiconductor wafer that has an active surface, a first metal line exposed on the active surface, the first metal line has a width of at least 5 $\mu$m and a first plurality of contacts/vias embedded therein along at least one of two opposite edges of the first metal line formed with zig-zag borders with the contacts/vias situated in protruded portions in the zig-zag borders, and a second metal line that has zig-zag borders, the second metal line has a width of at least 5 $\mu$m and a second plurality of contacts/vias embedded therein along at least one of two opposite edges of the line with the contacts/vias in protruded portions of the zig-zag, each of the second plurality of the contacts/vias is positioned to align with a corresponding contact/via in the first metal line.

In the semiconductor wafer that has patterns of wide metal lines exposed thereon, the first metal line and the second metal line each has a width of at least 10 $\mu$m. The zig-zag borders may be formed in a waveform.

The present invention is still further directed to a semiconductor wafer that has patterns of wide metal lines exposed thereon which includes a semiconductor wafer that has an active surface, a first metal line exposed on the active surface, the first metal line has a width of at least 5 $\mu$m and a first plurality of contacts/vias embedded therein along at least one of two opposite edges of the first metal line formed with zig-zag borders with the contacts/vias situated in protruded portions in the zig-zag borders, each of the first plurality of contacts/vias is spaced from its immediate adjacent contact/via at a pre-set spacing, and a second metal line that has zig-zag borders, the second metal line has a width of at least 5 $\mu$m and a second plurality of contacts/vias embedded therein along at least one of two opposite edges of the line with the contacts/vias in protruded portions of the zig-zag, each of the second plurality of the contacts/vias is positioned to align with a pre-set spacing between two adjacent contacts/vias in the first metal line.

In the semiconductor wafer that has patterns of wide metal lines exposed thereon, the first metal line and the second metal line each has a width between about 5 $\mu$m and about 20 $\mu$m. The zig-zag borders may be formed in a waveform.

BRIEF DESCRIPTION OF THE DRAWINGS

These and other objects, features and advantages of the present invention will become apparent from the following detailed description and the appended drawings in which:

FIG. 4A is an enlarged, plane view of a conventional photomask layout of 2 wide metal lines with a spacing of 0.45 $\mu$m thereinbetween.

FIG. 4B is an enlarged, plane view of the wide metal lines layout of FIG. 4A after being exposed and developed on a wafer surface illustrating a narrowed spacing between the lines.

FIG. 4C is a scanning profile of the wide metal lines of FIG. 4B after formation by a scanning electron microscopy.

FIG. 5A is an enlarged, plane view of a present invention wide metal lines layout on a photomask illustrating a zig-zag bordered structure.

FIG. 5B is an enlarged, plane view of the wide metal line layout of FIG. 5A after being exposed and developed on a wafer surface illustrating an enlarged spacing between the lines.

FIG. 5C is a scan of wide metal lines after formation from the pattern of 5B obtained by scanning electron microscopy illustrating the improved spacing between the lines.

DETAILED DESCRIPTION OF THE PREFERRED EMBODIMENT

The present invention discloses a method for laying out wide metal lines embedded with contacts/vias on a photomask with improved process window and semiconductor wafers that have patterns of wide metal lines exposed thereon by such method.

The present invention novel method utilizes wave or interlacing type wide metal layout to improve process window in a photomasking process. A wave or interlacing type wide metal layout can be used on the opposite wide metal line provided with contact/via along the metal edge such that wider process window can be achieved due to metal rounding effect of the metal line end. By utilizing the present invention novel method, one can tighten layout rule for wide metal lines, i.e., one can obtain wider process window, or wider spacing when the present invention novel layout method is utilized.

The present invention novel method eliminates the problem normally encountered in a conventional wide metal line layout scheme in which more relaxed layout rule than generic metal lines must be used due to the fact that the photoprocess window is narrower on the wide metal line. When the present invention new layout, i.e., the wave or interlacing type layout, is used on the wide metal line in either pattern shown in FIG. 2, one can obtain improved process window by the metal line end rounding effect on the process.

Figure 1:
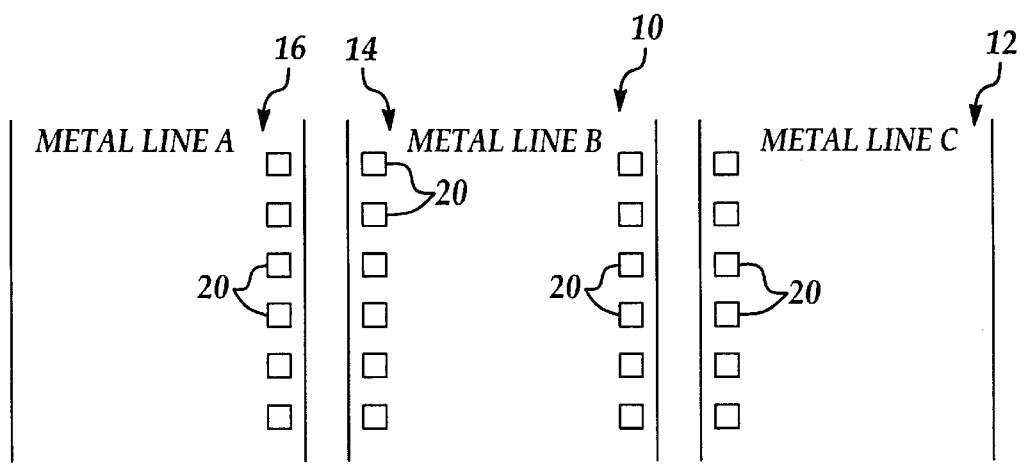
FIG. 1 is an enlarged, plane view of a conventional layout of wide metal lines embedded with contacts/vias.

Referring initially to FIG. 1 wherein an enlarged, plane view of a conventional wide metal line layout scan of a photomask is shown. The wide metal line layout 10 includes metal line 12, 14 and 16. In each of the metal lines, a plurality of contacts or vias 20 are embedded along an edge portion of the line. The edge of the metal lines is formed in a straight line without any pattern. The width of each of the metal lines 12, 14 and 16 is larger than 5 $\mu$m, and preferably larger than 10 $\mu$m. A suitable range of width for the metal lines is between about 5 $\mu$m and about 20 $\mu$m. The word "about" used in the context of this writing is to mean a range of value between ±10% of the average value given. The wide metal lines 12, 14 and 16 is substantially wider for a typical metal line that is frequently used as a metal trace on a semiconductor device, i.e., a trace having a width of between about 0.5 $\mu$m and about 0.6 $\mu$m for a 0.3 $\mu$m device. The metal lines are usually formed to a thickness of about 8,000 521.

The drawbacks of the conventional metal line layout shown in FIG. 1 is illustrated in FIGS. 4A, 4B and 4C. FIG. 4A shows an enlarged, plane view of a conventional layout of wide metal lines 22, 24 each has a contact/via 26 embedded therein. A line-to-line distance 28 is approximately 0.45 $\mu$m as formed on a photomask. After the photomask 30 is exposed and developed on the surface of wafer 32, the line-to-line distance 34 is reduced to 0.38 $\mu$m, shown in FIG. 4B. The process window is therefore narrower and more difficult to carry out in order to avoid bridging or leakage problems between the metal lines 22, 24. The line-to-line distance 34 of 0.38 $\mu$m is further confirmed by a SEM (Scanning Electron Microscopy) trace shown in FIG. 4C, after metal lines are formed on the surface of wafer 32.

Figure 2:
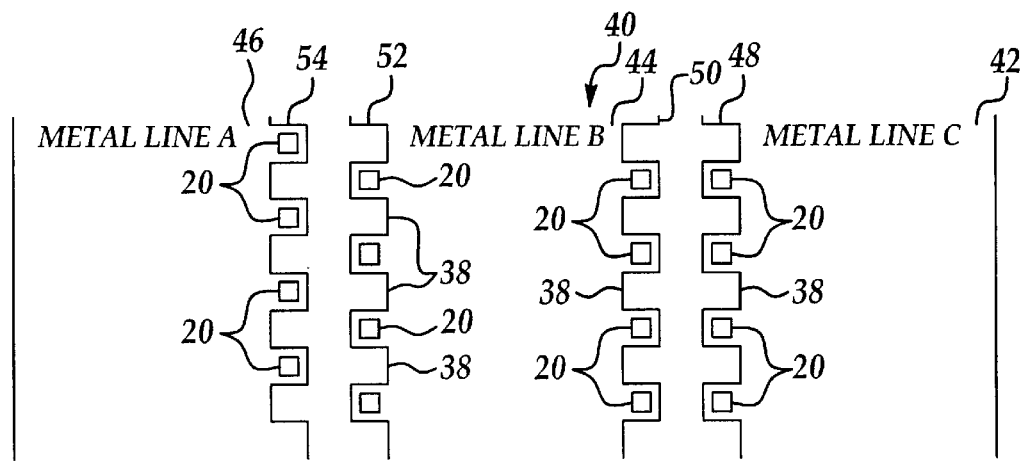
FIG. 2 is an enlarged, plane view of a present invention photomask of wide metal lines with zig-zag borders embedded with contacts/vias.

The present invention wide metal line layout 40 is shown in FIG. 2. In layout 40, metal lines 42, 44 and 46 are formed side-by-side with zig-zag borders 48, 50, 52 and 54. On the left hand side of FIG. 2, the zig-zag borders 52, 54 are formed in a wave type such that each of the contact/via 20 is positioned corresponding to a pre-set spacing 38 in between the contact/vias 20 in the zig-zag border 42. The zig-zag borders 48, 50 shown on the right hand side of FIG. 2 is arranged in an interlacing manner such that each contact/via 20 in the zig-zag border 50 is positioned corresponding to a contact/via 20 in the zig-zag border 48. While only two embodiments, i.e., the wave type and the interlacing type are shown in FIG. 2, it should be noted that there may be other equally suitable configurations that can be used advantageously to carry out the present invention novel method of zig-zag bordered wide metal lines.

Figure 3:
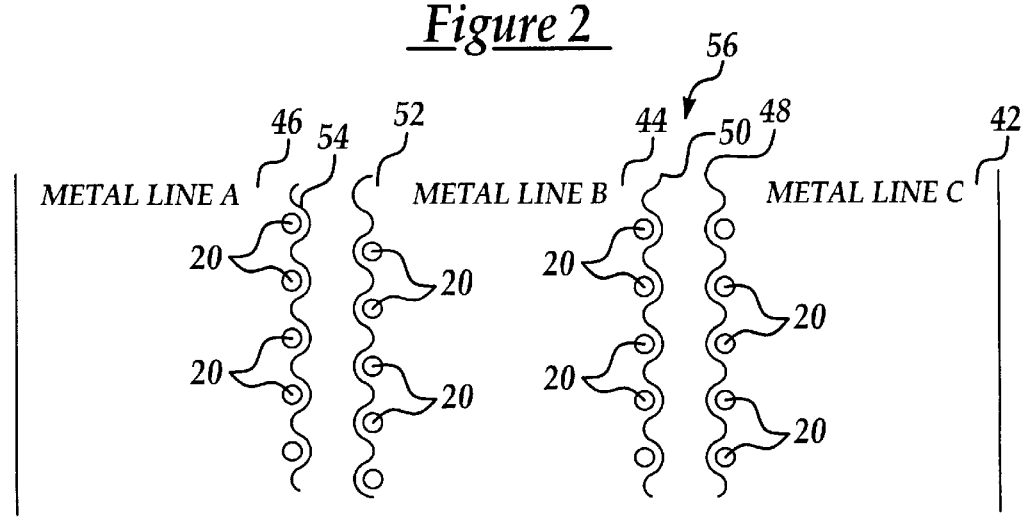
FIG. 3 is an enlarged, plane view of the photomask layout of FIG. 2 after being exposed on a wafer surface and transformed into a waveform border.

After the pattern of the wide metal lines shown in FIG. 2 are exposed and developed on wafer 56 as shown in FIG. 3, the zig-zag borders 48~54 in square saw-tooth shape is changed, or smoothed out to a wave form as shown in FIG. 3. The contact/via 20 are also smoothed out to have a rounded appearance while maintaining the wave or interlacing pattern. The effectiveness of the present invention zig-zag bordered wide metal lines is further shown in FIGS. 5A, 5B and 5C. FIG. 5A illustrates a present invention wide metal line pattern 60 as formed on a photomask with first metal line 62 and second metal line 64. It should be noted that each metal line embeds a contact/via 66. As shown in FIG. 5A, the line-to-line distance between the protruded portion of the zig-zag is about 0.45 $\mu$m which expands to about 0.59 $\mu$m after being exposed and developed on a wafer, as shown in layout 70 in FIG. 5B. Similarly, the line-to-line distance between the recessed portions of wide metal lines 62, 64 is about 0.63 $\mu$m, which expands to about 0.65 $\mu$m after being exposed and developed on wafer. The advantages made possible by the present invention novel method of providing zig-zag bordered wide metal lines are self-evident by an examination of FIGS. 5A and 5B. A trace of line-to-line spacing by SEM on metal lines subsequently formed on wafer is shown in FIG. 5C. The line-to-line distance y is significantly larger than the line-to-line distance x shown in FIG. 4C.

Figure 6A:
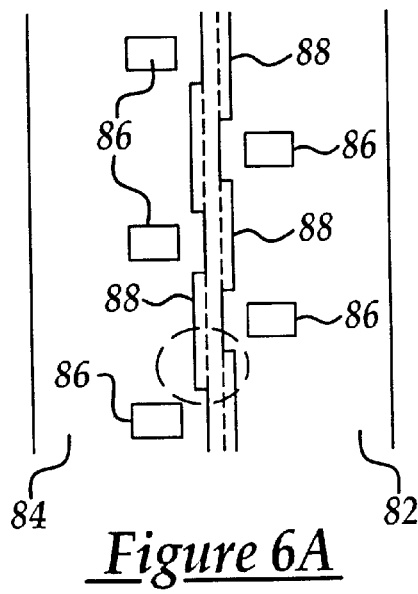
FIG. 6A is an enlarged, plane view of a present invention layout of wide metal lines with zig-zag borders with a contact/via in the first metal line positioned juxtaposed to a spacing in the second metal line.
Figure 6B:
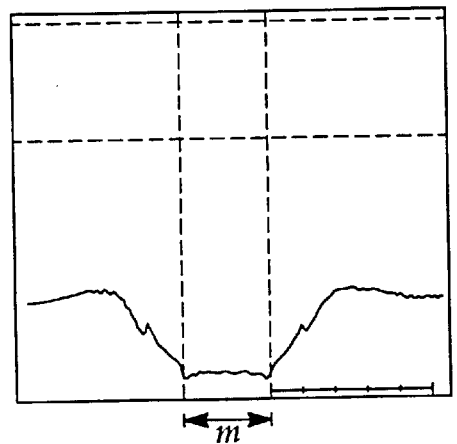
FIG. 6B is a trace of the spacing between the wide metal lines of FIG. 6A.
Figure 7A:
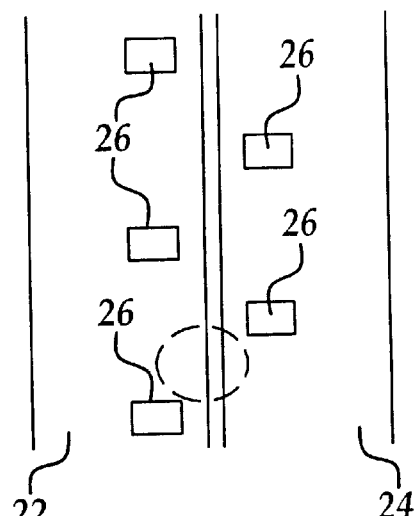
FIG. 7A is an enlarged, plane view of a conventional layout of wide metal lines with a contact/via in the first metal line positioned juxtaposed to a spacing in the second metal line.

In another preferred embodiment, as shown in FIGS. 6A and 6B, a different type of zig-zag bordered wide metal lines 82 and 84 are shown each embedded with contact/via 86. In this wave type arrangement, each of the contact/via 86 is positioned juxtaposed to a pre-set spacing 88 on the opposite metal line. This can be compared to a conventional set-up shown in FIG. 7A with straight-line borders for metal lines 22, 24. The layout shown in FIG. 7A is of the wave type, when compared to the layout of the interlacing type shown in FIG. 4A.

Figure 7B:
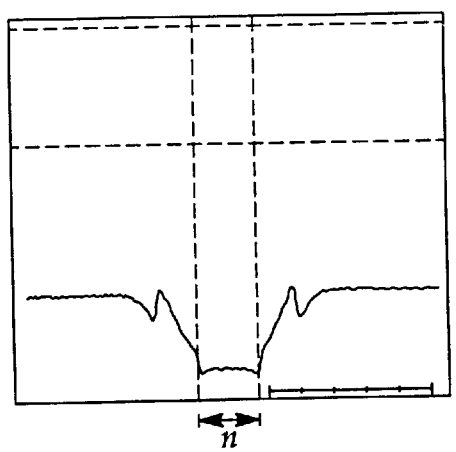
FIG. 7B is a trace illustrating the space between the wide metal lines of FIG. 7A obtained by scanning electron microscopy.

The SEM trace obtained on the spacing between metal lines formed on a wafer is shown in FIGS. 6B and 7B. It is seen that the line-to-line spacing m in FIG. 6B is significantly larger than the line-to-line spacing n shown in FIG. 7B further illustrating the present invention desirable results.

The present invention novel method for laying out wide metal lines embedded with contacts/vias on a photomask with improved process window and semiconductor substrate prepared by the method have therefore been amply described in the above description and in the appended drawings of FIGS. 2–3 and 5A–6B.

While the present invention has been described in an illustrative manner, it should be understood that the terminology used is intended to be in a nature of words of description rather than of limitation.

Furthermore, while the present invention has been described in terms of two preferred embodiments, it is to be appreciated that those skilled in the art will readily apply these teachings to other possible variations of the inventions.

The embodiment of the invention in which an exclusive property or privilege is claimed are defined as follows.

What is claimed is:

1. A method for laying out metal lines embedded with contacts/vias on a mask with improved process window comprising the steps of:

laying out a first metal line having zig-zag borders a width of at least 5 µm and a first plurality of contacts/vias along at least one of the opposite edges of the line with said contacts/vias in protruded portions of the zig-zag on a mask, each of said first plurality of contacts/vias being spaced from its immediate adjacent contact/via at a preset spacing, and laying out a second metal line having zig-zag borders a width of at least 5 µm and a second plurality of contacts/vias along at least one of two opposite edges of the line with said contacts/vias in protruded portions of the zig-zag on said mask, each of said second plurality of contacts/vias being spaced from its immediate adjacent contact/via at said preset spacing, each of said second plurality of contacts/vias being further positioned to align with either a corresponding contact/via in said first metal line or a spacing between two adjacent contacts/vias in said first metal line such that a process window that is larger than a line-to-line spacing for metal lines having straight-line borders is obtained in a subsequent photolithographic process.

2. A method of laying out metal lines embedded with contacts/vias on a mask with improved process window according to claim 1, wherein said first and second metal lines each having a width of at least 10 µm.

3. A method of laying out metal lines embedded with contacts/vias on a mask with improved process window according to claim 1, wherein said zig-zag boarders change into a waveform after being exposed and developed onto a wafer.

4. A method of laying out metal lines embedded with contacts/vias on a mask with improved process window according to claim 1, wherein said zig-zag boarders have a square saw-tooth shape.

5. A method of laying out metal lines embedded with contacts/vias on a mask with improved process window according to claim 1, further comprising the step of positioning said second metal line next to the first metal line such that each of said second plurality of contacts/vias in said second metal line is juxtaposed to one of said first plurality of contacts/vias in said first metal line.

6. A method of laying out metal lines embedded with contacts/vias on a mask with improved process window according to claim 1, further comprising the step of positioning said second metal line next to the first metal line such that each of said second plurality of contacts/vias in said second metal line is juxtaposed to one of said spacing between two adjacent contacts/vias in said first metal line.

7. A method of laying out metal lines embedded with contacts/vias on a mask with improved process window according to claim 1, wherein said process window is at least about 5% larger than line-to-line spacing for metal lines having straight-line boarders.

8. A method of laying out metal lines embedded with contacts/vias on a mask with improved process window according to claim 1, wherein said process window is between about 5% and about 30% larger than line-to-line spacing for metal lines having straight-line boarders.

9. A semiconductor wafer having patterns of wide metal lines exposed thereon comprising:

a semiconductor wafer having an active surface, a first metal line exposed on said active surface, said first metal line having a width of at least 5 µm and a first plurality of contacts/vias embedded therein along at least one of two opposite edges of said first metal line formed with zig-zag borders with said contacts/vias situated in protruded portions in la said zig-zag borders, and a second metal line having zig-zag borders, said second metal line having a width of at least 5 µm and a second plurality of contacts/vias embedded therein along at least one of two opposite edges of the line with the contacts/vias in protruded portions of the zig-zag, each of said second plurality of contacts/vias being positioned to align with a corresponding contacts/vias in said first metal line.

10. A semiconductor wafer having patterns of wide metal lines exposed thereon according to claim 9, wherein said first metal line and said second metal line each having a width of at least 10 µm.

11. A semiconductor wafer having patterns of wide metal lines exposed thereon according to claim 9, wherein said zig-zag boarders are formed in a waveform.

12. A semiconductor wafer having patterns of wide metal lines exposed thereon comprising:

a semiconductor wafer having an active surface, a first metal line exposed on said active surface, said first metal line having a width of at least 5 µm and a first plurality of contacts/vias embedded therein along at least one of two opposite edges of said first metal line formed with zig-zag borders with said contacts/vias situated in protruded portions in said zig-zag boarders, each of said first plurality of contacts/vias being spaced from its immediate adjacent contacts/vias at a present spacing, and a second metal line having zig-zag borders, said second metal line having a width of at least 5 µm and a second plurality of contacts/vias embedded therein along at least one of two opposite edges of the line with the contacts/vias in protruded portions of the zig-zag, each of said second plurality of contacts/vias being positioned to align with a preset spacing between two adjacent contacts/vias in said first metal line.

13. A semiconductor wafer having patterns of wide metal lines exposed thereon according to claim 12, wherein said first metal line and said second metal line each having a width between about 5 µm and about 20 µm.

14. A semiconductor wafer having patterns of wide metal lines exposed thereon according to claim 12, wherein said zig-zag boarders are formed in a waveform.

* * * * *